United States Patent [19]

Heimsch et al.

[11] Patent Number: 4,939,478
[45] Date of Patent: Jul. 3, 1990

[54] ASYMMETRICAL DIFFERENTIAL AMPLIFIER AS LEVEL CONVERTER

[75] Inventors: Wolfgang Heimsch; Ernst Muellner, both of Munich, Fed. Rep. of Germany

[73] Assignee: Siemens Aktiengesellschaft, Berlin and Munich, Fed. Rep. of Germany

[21] Appl. No.: 282,695

[22] Filed: Dec. 12, 1988

[30] Foreign Application Priority Data

Feb. 5, 1988 [DE] Fed. Rep. of Germany ....... 3803544

[51] Int. Cl.⁵ .............................................. H03F 3/45
[52] U.S. Cl. .................................. 330/253; 330/300; 307/475
[58] Field of Search ................... 330/252, 253, 302; 307/446, 475

[56] References Cited

U.S. PATENT DOCUMENTS 4,782,251 11/1988 Tsugaru et al. ...................... 307/475

OTHER PUBLICATIONS

"Halbleiter-Schaltungstechnik", by Tietze-Schenk, 5th revised edition, pp. 59-64.

*Primary Examiner*—James B. Mullins
*Attorney, Agent, or Firm*—Hill, Van Santen, Steadman & Simpson

[57] ABSTRACT

An asymmetrical differential amplifier as a level converter has two transistors, a constant current source and two resistors, whereby the first transistor is a MOS transistor and the second transistor is a bipolar npn transistor. Input signals having CMOS level can be applied to an input on the input side of the differential amplifier, whereas output signals having ECL level can be taken at an output. In addition to being a differential amplifier, the circuit also produces a level conversion between CMOS level at the input side and ECL level at the output side.

14 Claims, 2 Drawing Sheets

ASYMMETRICAL DIFFERENTIAL AMPLIFIER AS LEVEL CONVERTER

BACKGROUND OF THE INVENTION

The present invention is directed to an asymmetrical differential amplifier as a level converter having a first and a second transistor, a constant current source and first and second resistors. A first terminal of the first transistor and a first terminal of the second transistor are connected in common to a first circuit terminal via the constant current source and a second terminal of the first transistor is connected to a second circuit terminal via the first resistor and a second terminal of the second transistor is connected to the second circuit terminal via the second resistor. A first input is connected to a control terminal of the first transistor, a second input ($V_{ref}$) is connected to a control terminal of the second transistor and a first output ($\bar{A}$) is connected to a second terminal of the first transistor and a second output (A) is connected to the second terminal of the second transistor.

A differential amplifier is a symmetrical DC amplifier having two inputs and two outputs. It is usually constructed with two transistors, whereby one terminal of each of the two transistors is connected to a constant current source. The constant current source provides that the sum of the currents through both transistors remains constant. When a voltage differing in amplitude is applied to the two inputs of the differential amplifier, then the current division in the differential amplifier varies. The current through one transistor increases whereas the current through the other transistor decreases. The sum of the two current magnitudes, however, is equal to the current magnitude that is supplied by the constant current source. An input voltage difference produces an output voltage change in a differential amplifier. A temperature-conditioned change of the voltages at the transistors acts like a common mode modulation and remains ineffective. A differential amplifier is therefore preferably also used as a DC amplifier.

Basic circuits for differential amplifiers have been known from the prior art literature for a long time. The book "Halbleiter-Schaltungstechnik" by Tietze-Schenk, Fifth revised edition, page 59, discloses the basic circuitry of a differential amplifier and the following pages 59–64 show the structure and the functioning of a differential amplifier composed of npn bipolar transistors. In contrast thereto, page 89 and FIG. 5.14 in the same reference show a basic circuit of a field effect differential amplifier, whereby this is constructed with two n-channel barrier [depletion] layer field effect transistors.

Significantly better results with respect to the input current, the bandwidth and the noise can be achieved by using field effect transistors in comparison to the circuit in FIG. 4.32 of the reference. Further particulars regarding field effect differential amplifiers may be found on pages 90–92 in the reference.

The realization of a differential amplifier either with bipolar transistors or with field effect transistors determines the advantages and disadvantages that are critical for the respective transistor form. The realization of a differential amplifier with bipolar transistors or in ECL technology has the disadvantage that the transistors must be insulated from one another. For a differential amplifier in this technology, very low logical output levels as a result of low currents yield a relatively high processing speed. The logical output levels usually lie in the range from 0 through 200 millivolts. Relatively high logical output levels result for a differential amplifier with field effect transistors, for example, using CMOS technique; however, such a circuit is slower in comparison to a differential amplifier that uses bipolar transistors. A relatively high packing density of the individual transistors is possible with the use of CMOS circuit technology. Logical output levels here lie between 0 and 5 volts.

SUMMARY OF THE INVENTION

An object of the present invention is to provide a differential amplifier that can be realized with a mixed ECL/CMOS circuit technology.

This object is achieved by an asymmetrical amplifier wherein the first transistor is a MOS transistor and the second transistor is a bipolar transistor. Input signals for the MOS transistor are received on the first input and a reference signal that lies between a maximum and minimum of the input signals for the MOS transistor is received on the second input.

The advantages achieved with the present invention is that, due to the mixed ECL/CMOS circuit technology, the asymmetrical differential amplifier outputs output boosts in the millivolt range at its two outputs that correspond to ECL levels and, also can process CMOS levels between 0 and 5 volts on a first input. Internal level fluctuations that occur at the common junction between the constant current source and the two transistors due to the switching of the CMOS transistor and that reduce the processing speed of the differential amplifier are reduced by the integration of the bipolar npn transistor. The boosts are set by the magnitude of the current with the current source and the output levels at the two outputs of the differential amplifier are independent of the range of the characteristics of the CMOS transistor. This is assured by a suitable selection of a reference voltage at the second input of the differential amplifier.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENTS

Figure 1:
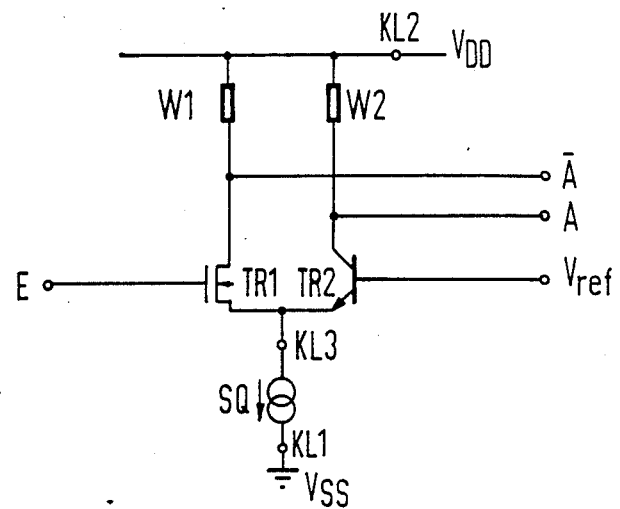
FIG. 1 is a circuit diagram of a differential amplifier in mixed ECL/CMOS circuit technology.

The asymmetrical differential amplifier shown in FIG. 1 contains a first n-channel MOS transistor TR1 and a second npn bipolar transistor TR2, a constant current source SQ as well as a first and a second resistor W1, W2. The value of resistance of the first and of the second resistors W1, W2, for example, can be dimensioned at 200 ohms and the current through the constant current source SQ should be 1mA. In this case, the current conduction through one of the two resistors amounts to 1mA and generates a voltage drop of 200 mV that is adequate for a ECL boost. A first terminal of the n-channel MOS transistor TR1 and the emitter terminal of the npn bipolar transistor TR2 are connected in common to the ground $V_{ss}$ via the constant current source SQ that is connected between terminals KL1 and KL3. The second terminal of the n-channel MOS transistor TR1 is connected to terminal KL2 via the first resistor W1 and the collector output of the npn bipolar transistor TR2 is likewise connected to the terminal KL2 via the second resistor W2.

Further, in the differential amplifier of FIG. 1 the terminal KL2 is connected to the supply voltage $V_{DD}$. The first input E at which CMOS input signals are applied is interconnected to the gate terminal of the n-channel MOS transistors TR1, whereas the second input $V_{ref}$ on which a reference signal is received is connected to the base terminal of the npn bipolar transistor TR2. The reference signal for the reference input $V_{ref}$ lies within the low and high level of the CMOS input signal. A first output $\overline{A}$ of the differential amplifier supplies an inverted output signal and is connected to the second terminal of the n-channel MOS transistor TR1, whereas the second output A supplies a non-inverted output signal and is connected to the collector terminal of the npn bipolar transistor TR2.

Figure 3:
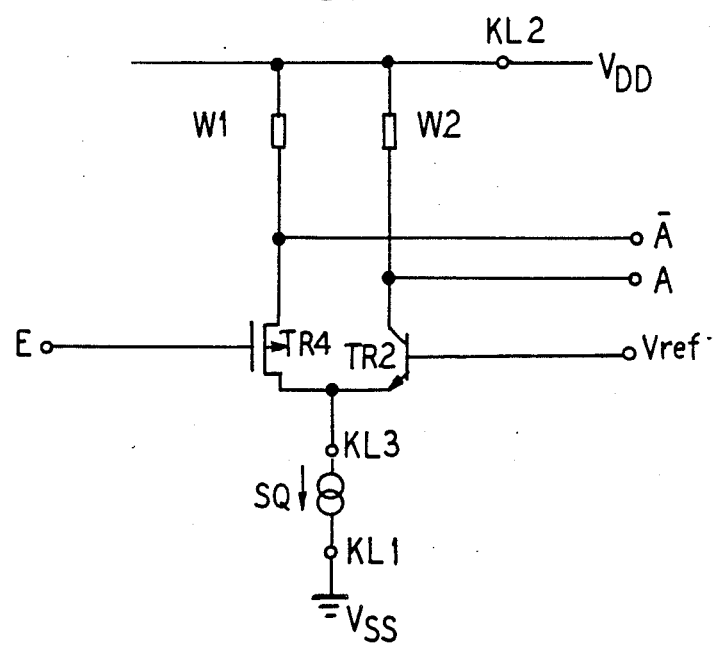
FIG. 3 is a circuit diagram of an alternative embodiment of the FIG. 1 circuit.

In the differential amplifier of FIG. an n-channel MOS transistor is provided for the first transistor TR1; however, it is also possible to use a p-channel MOS transistor. In this case, the first and second outputs $\overline{A}$, A are to be interchanged with one another. As shown in FIG. 3 a p-channel MOS transistor TR4 is connected in place of transistor TR1 (see FIG. 1) in the differential amplifier. The first and second outputs ($\overline{A}$, A) are interchanged with one another in the sense that the first output ($\overline{A}$) supplies a non-inverted signal and the second output (A) supplies a further output signal inverted with respect to the non-inverted output signal.

The circuit of FIG. 1 yields a level matching between CMOS level at the input side and ECL level at the output side. Logical "high" or "low" levels between 5 and 0 volts are accordingly connected to the input E, whereas output boosts in the millivolt region, for example, between 0 and a few 100 mV, can be tapped at the outputs A, or $\overline{A}$. This enables a direct connection of circuits in ECL technology that have a higher processing speed in comparison to CMOS circuits. The asymmetrical differential amplifier circuit of FIG. 1 is especially well-suited for integration in adder cells wherein ECL circuits provide an especially fast processing of signals.

Figure 2:
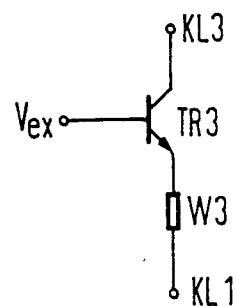
FIG. 2 is a circuit diagram of the constant current source for the differential amplifier.

FIG. 2 shows one possible embodiment of the constant current source SQ that is connected between the terminals KL3 and KL1. The constant current source contains a further bipolar npn transistor TR3 at whose base terminal a fixed voltage $V_{ex}$ is connected, whereby this fixed voltage $V_{ex}$ defines the magnitude of the current for the asymmetrical differential amplifier circuit of FIG. 1. A resistor W3 whose value of resistance should be approximately 500 ohms is connected between the emitter terminal of the further bipolar npn transistor TR3 and the terminal KL1. The resistor W3 yields a negative current feedback that leads to a stable constant current. The resistor W3 should therefore not be excessively small.

The constant current source of FIG. 2 shows only one of a number of possibilities of a constant current source for the differential amplifier of FIG. 1. Further possibilities for such a constant current source, for example, may be derived from the technical reference "Halbleiterschaltungstechnik" by Tietze-Schenk, fifth edition, pages 53 through 56 and on page 87.

Figure 4:
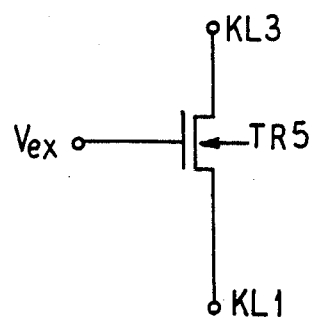
FIG. 4 is a circuit diagram of an alternative embodiment of the contact current source for the differential amplifier.

As shown in FIG. 4 of the drawings, the constant current source SQ can be an n-channel MOS transistor TR5, wherein a first terminal is connected to the first circuit terminal KL1, a second terminal is connected to the third circuit terminal KL3 and a gate terminal is connected to a fixed voltage Vex.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An asymmetrical differential amplifier having a first and a second transistor, a constant current source and first and second resistors, whereby a first terminal of the first transistor and a first terminal of the second transistor are connected in common to a first circuit terminal via the constant current source and a second terminal of the first transistor is connected to a second circuit terminal via the first resistor and a second terminal of the second transistor is connected to the second circuit terminal via the second resistor, a first input is connected to a control terminal of the first transistor, a second input ($V_{ref}$) is connected to a control terminal of the second transistor and a first output ($\overline{A}$) is connected to the second terminal of the first transistor and a second output (A) is connected to the second terminal of the second transistor, comprising the first transistor being a MOS transistor and the second transistor being a bipolar transistor; input signals for the MOS transistor being received on the first input and a reference signal that lies between a maximum and minimum of the input signals for the MOS transistor being received on the second input.

2. The asymmetrical differential amplifier according to claim 1, wherein the first transistor is an n-channel MOS transistor and the second transistor is an npn bipolar transistor.

3. The asymmetrical differential amplifier according to claim 1, wherein the first transistor is a p-channel MOS transistor and the second transistor is an npn bipolar transistor and the first output ($\overline{A}$) supplies a non-inverted output signal with respect to the input signal and the second output (A) supplies a further output signal inverted with respect to the non-inverted output signal.

4. The asymmetrical differential amplifier according to claim 1, wherein the constant current source has a further bipolar npn transistor; wherein a base terminal of the further npn transistor is connected to a fixed voltage ($V_{ex}$), an emitter terminal of the further bipolar npn transistor is connected to the first circuit terminal via a third resistor and a collector terminal of the further bipolar npn transistor is connected to the first terminal of the first transistor and to the first terminal of the second transistor.

5. The asymmetrical differential amplifier according to claim 1, wherein the constant current source is an n-channel MOS transistor; wherein a first terminal of the n-channel MOS transistor is connected to the first circuit terminal, a second terminal of the n-channel MOS transistor is connected to the first terminal of the first transistor and to the first terminal of the second transistor; and wherein a gate terminal of the n-channel MOS transistor is connected to a fixed voltage.

6. The asymmetrical differential amplifier according to claim 1, wherein the first circuit terminal is connected to ground and the second circuit terminal is connected to a supply voltage.

7. An asymmetrical differential amplifier having a first and a second transistor, a constant current source and first and second resistors, whereby a first terminal of the first transistor and a first terminal of the second transistor are connected in common to a first circuit terminal via the constant current source and a second terminal of the first transistor is connected to a second circuit terminal via the first resistor and a second terminal of the second transistor is connected to the second circuit terminal via the second resistor, a first input is connected to a control terminal of the first transistor, a second input ($V_{ref}$) is connected to a control terminal of the second transistor and a first output ($\overline{A}$) is connected to the second terminal of the first transistor and a second output (A) is connected to the second terminal of the second transistor, comprising the first transistor being a MOS transistor and the second transistor being a bipolar transistor; input signals for the MOS transistor being received on the first input and a reference signal that lies between a maximum and minimum of the input signals for the MOS transistor being received on the second input; and the constant current source having a further bipolar npn transistor, a base terminal of the further npn transistor connected to a fixed voltage ($V_{ex}$), an emitter terminal of the further bipolar npn transistor connected to the first circuit terminal via a third resistor and a collector terminal of the further bipolar npn transistor connected to the first terminal of the first transistor and to the first terminal of the second transistor.

8. The asymmetrical differential amplifier according to claim 7, wherein the first circuit terminal is connected to ground and the second circuit terminal is connected to a supply voltage.

9. The asymmetrical differential amplifier according to claim 7, wherein the first transistor is an n-channel MOS transistor and the second transistor is an npn bipolar transistor.

10. The asymmetrical differential amplifier according to claim 7, wherein the first transistor is a p-channel MOS transistor and the second transistor is an npn bipolar transistor and the first output ($\overline{A}$) supplies a non-inverted output signal with respect to the input signal and the first output (A) supplies a further output signal inverted with respect to the non-inverted output signal.

11. An asymmetrical differential amplifier having a first and a second transistor, a constant current source and first and second resistors, whereby a first terminal of the first transistor and a first terminal of the second transistor are connected in common to a first circuit terminal via the constant current source and a second terminal of the first transistor is connected to a second circuit terminal via the first resistor and a second terminal of the second transistor is connected to the second circuit terminal via the second resistor, a first input is connected to a control terminal of the first transistor, a second input ($V_{ref}$) is connected to a control terminal of the second transistor and a first output ($\overline{A}$) is connected to the second terminal of the first transistor and a second output (A) is connected to the second terminal of the second transistor, comprising the first transistor being a MOS transistor and the second transistor being a bipolar transistor; input signals for the MOS transistor being received on the first input and a reference signal that lies between a maximum and minimum of the input signals for the MOS transistor being received on the second input; the constant current source is a n-channel MOS transistor; where in a first terminal of the n-channel transistor is connected to the first circuit terminal, a second terminal of the n-channel MOS transistor is connected to the first terminal of the first transistor and to the first terminal of the second transistor; and wherein a gate terminal of the n-channel MOS transistor is connected to the fixed voltage.

12. The asymmetrical differential amplifier according to claim 11, wherein the first circuit terminal is connected to ground and the second circuit terminal is connected to a supply voltage.

13. The asymmetrical differential amplifier according to claim 12, wherein the first transistor is an n-channel MOS transistor and the second transistor is an npn bipolar transistor and wherein the second output (A) supplies a non-inverted output signal and the first output ($\overline{A}$) supplies a further output signal inverted with respect to the non-inverted output signal.

14. The asymmetrical differential amplifier according to claim 12, wherein the first transistor is a p-channel MOS transistor and the second transistor is an npn bipolar transistor and the first output ($\overline{A}$) supplies a non-inverted output signal with respect to the input signal and the first output (A) supplies a further output signal inverted with respect to the non-inverted output signal.

* * * * *